(12) United States Patent
Tsai

(10) Patent No.: US 9,280,167 B2
(45) Date of Patent: Mar. 8, 2016

(54) PARALLEL POWER SUPPLY AND POWER DETECTION METHOD FOR PARALLEL POWER SUPPLY

(71) Applicant: 3Y POWER TECHNOLOGY (TAIWAN), INC., Taoyuan (TW)

(72) Inventor: Chih-Chang Tsai, Taoyuan County (TW)

(73) Assignee: 3Y POWER TECHNOLOGY (TAIWAN), INC., Gueishan Shiang, Taoyuan (TW)

( * ) Notice: Subject to any disclaimer, the term of this patent is extended or adjusted under 35 U.S.C. 154(b) by 227 days.

(21) Appl. No.: 14/017,326

(22) Filed: Sep. 4, 2013

(65) Prior Publication Data

US 2014/0063878 A1 Mar. 6, 2014

(30) Foreign Application Priority Data

Sep. 6, 2012 (TW) .............................. 101132559 A

(51) Int. Cl.
*H02M 7/5383* (2007.01)
*G05F 3/00* (2006.01)
*H02J 1/10* (2006.01)
*G01R 31/40* (2014.01)

(52) U.S. Cl.
CPC ... *G05F 3/00* (2013.01); *H02J 1/10* (2013.01); *G01R 31/40* (2013.01)

(58) Field of Classification Search
CPC ............... G05F 3/00; H02J 1/10; G01R 31/40
USPC .............................................. 363/74; 323/285
See application file for complete search history.

(56) References Cited

U.S. PATENT DOCUMENTS 7,646,620 B2 * 1/2010 MacDonald et al. ......... 363/142
7,936,349 B2 * 5/2011 Suzuki .......................... 345/212

FOREIGN PATENT DOCUMENTS

TW         M389849         10/2010

* cited by examiner

*Primary Examiner* — Jessica Han
*Assistant Examiner* — Lorena Bruner
(74) *Attorney, Agent, or Firm* — Winston Hsu; Scott Margo

(57) ABSTRACT

A parallel power supply includes a built-in test switch and a control and determination unit. The built-in test switch is arranged to generate a first detection signal. The control and determination unit is coupled to the built-in test switch. When receiving the first detection signal, the control and determination unit is operative for enabling a detection mechanism according to the first detection signal in order to detect an operation of the parallel power supply, and accordingly generating a detection result. A power detection method for a parallel power supply includes: disposing a built-in test switch inside the parallel power supply; and when receiving a first detection signal generated from the built-in test switch, enabling a detection mechanism according to the first detection signal in order to detect an operation of the parallel power supply, and accordingly generating a detection result.

16 Claims, 3 Drawing Sheets

PARALLEL POWER SUPPLY AND POWER DETECTION METHOD FOR PARALLEL POWER SUPPLY

BACKGROUND OF THE INVENTION

1. Field of the Invention

The disclosed embodiments relate to a power supply, and more particularly, to a parallel power supply which does not need to be inserted into a system or a fixture for power detection, and a related power detection method thereof.

2. Description of the Prior Art

A parallel power supply (e.g. a redundant power supply) conventionally needs to be inserted into a load device (e.g. a system or a fixture) in order to determine whether the parallel power supply operates normally. For example, a test engineer may use a fixture to detect a parallel power supply assembled on a production line for yield management. In a server room, a system engineer needs to insert the parallel power supply into a system to promptly determine whether the parallel power supply operates normally. If the parallel power supply has a serious electrical problem, the insertion, however, may increase the risk of damaging data on the client side or damaging the system. Additionally, when it is detected that the parallel power supply does not operate normally, associated adjustment (e.g. re-insertion into the fixture) may be required. If the parallel power supply is inserted into and pulled out of the system frequently, the system may be damaged. Moreover, as pins of the parallel power supply may be different, different types of test fixtures are required. The test engineer may have no suitable fixtures.

SUMMARY OF THE INVENTION

It is one objective of the present invention to provide a parallel power supply which does not need to be inserted into a system or a fixture for power detection, and a related power detection method to solve the above problems.

According to an embodiment of the present invention, an exemplary parallel power supply is disclosed. The exemplary parallel power supply comprises a built-in test switch and a control and determination unit. The built-in test switch is arranged to generate a first detection signal. The control and determination unit is coupled to the built-in test switch. When receiving the first detection signal, the control and determination unit is operative for enabling a detection mechanism according to the first detection signal in order to detect an operation of the parallel power supply, and accordingly generating a detection result.

According to an embodiment of the present invention, an exemplary power detection method for a parallel power supply is disclosed. The exemplary power detection method comprises the following steps: disposing a built-in test switch inside the parallel power supply; and when receiving a first detection signal generated from the built-in test switch, enabling a detection mechanism according to the first detection signal in order to detect an operation of the parallel power supply, and accordingly generating a detection result.

The proposed parallel power supply includes a built-in test switch so that the power detection may be performed without inserting the proposed parallel power supply into a system or a fixture. Hence, an internal operation of the power supply may be clarified quickly, and almost no extra cost is required. In addition, a test engineer can readily determine quality of a power supply through a display/audio unit merely by adding a test switch inside the power supply.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
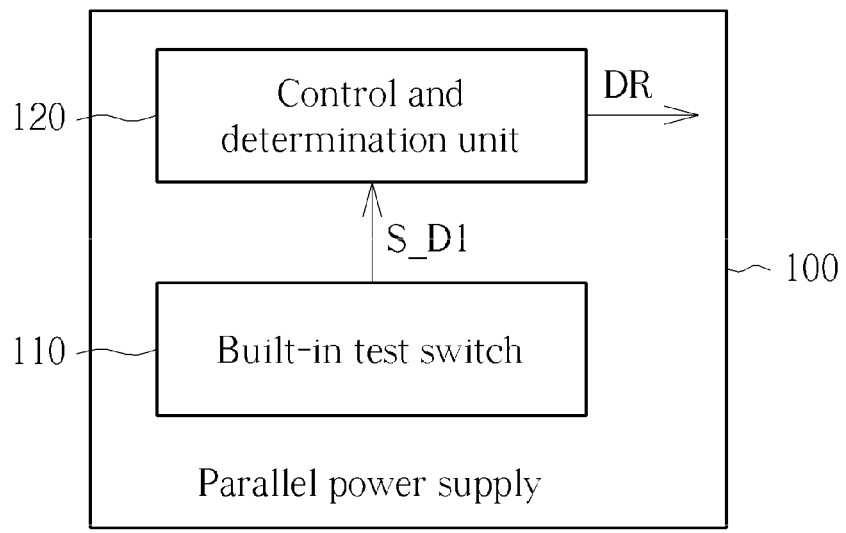
FIG. 1 is a diagram illustrating an exemplary parallel power supply according to an embodiment of the present invention.

Please refer to FIG. 1, which is a diagram illustrating an exemplary parallel power supply according to an embodiment of the present invention. The parallel power supply 100 includes, but is not limited to, a built-in test switch 110 and a control and determination unit 120. As shown in FIG. 1, the built-in test switch 110 is arranged to generate a first detection signal S_D1. The control and determination unit 120 is coupled to the built-in test switch 110. When receiving the first detection signal S_D1, the control and determination unit 120 is operative for enabling a detection mechanism according to the first detection signal S_D1 in order to detect an operation of the parallel power supply 100, and accordingly generating a detection result DR. For example, the built-in test switch 110 may be a key switch. When the key switch (i.e. the built-in test switch 110) is pressed, the control and determination unit 120 may receive the first detection signal S_D1 and enable the detection mechanism in order to detect the operation of the parallel power supply 100; when the pressed key switch (i.e. the built-in test switch 110) is released, the control and determination unit 120 may disable the detection mechanism. In other words, after the detection mechanism is enabled, the detection mechanism operates until the first detection signal S_D1 indicates disabling the detection mechanism. Please note that the above is for illustrative purposes only, and is not meant to be a limitation of the present invention. For example, the detection mechanism may be enabled when the key switch is released, and may be disabled when the key switch is pressed. Additionally, the implementation of the built-in test switch 110 is not limited to the key switch.

Figure 2:
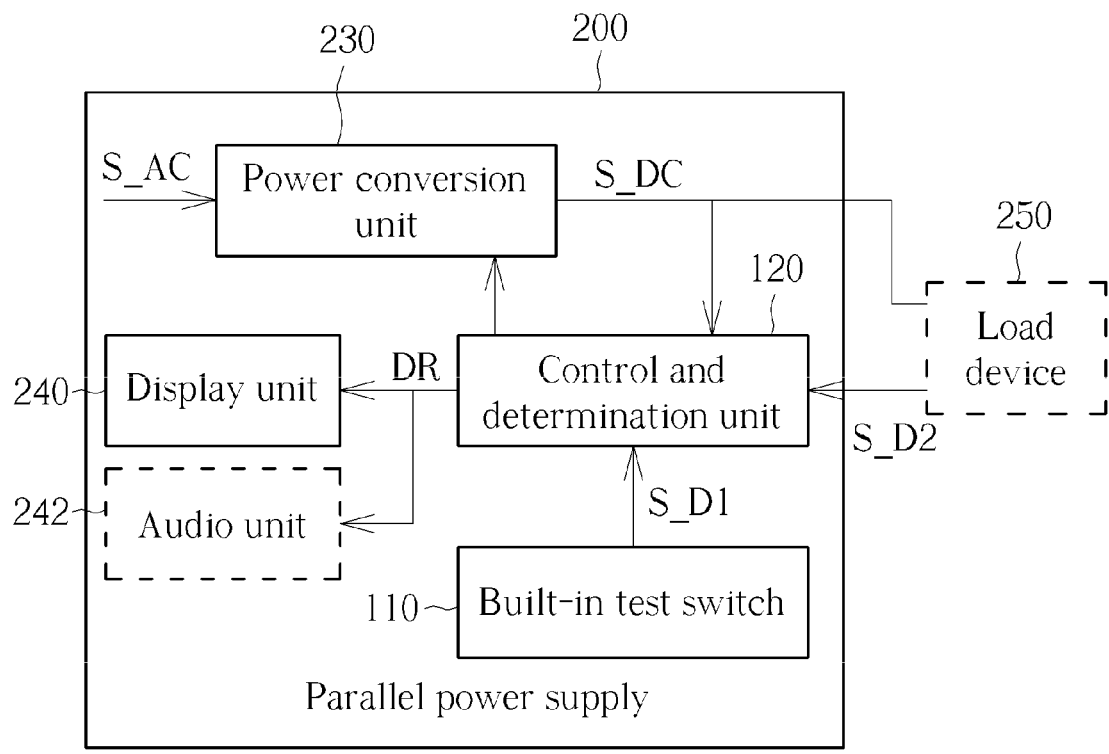
FIG. 2 is an implementation of the parallel power supply shown in FIG. 1.

In one embodiment, the control and determination unit 120 may further refer to the detection result DR to determine whether to disable a power supplying operation of the parallel power supply 100. Please refer to FIG. 2, which is an implementation of the parallel power supply 100 shown in FIG. 1. As shown in FIG. 2, in addition to the built-in test switch 110 and the control and determination unit 120 shown in FIG. 1, the parallel power supply 200 may further include a power conversion unit 230 and a display unit 240. The power conversion unit 230 is coupled to the control and determination unit 120, and is arranged for receiving an alternating-current (AC) power signal S_AC, wherein when the control and determination unit 120 receives the first detection signal S_D1 to enable the detection mechanism, the control and determination unit 120 may control the power conversion unit 230 to convert the AC power signal S_AC into a direct-current (DC) power signal S_DC, and detect the DC power signal S_DC to generate the detection result DR. In brief, when the control and determination unit 120 enables the detection mechanism, the control and determination unit 120 may control the power conversion unit 230 to perform power conversion, and detect an output power of the power conversion unit 230. In this implementation, the detection result DR may be a voltage detection result or a current detection result. This is not meant to be a limitation of the present invention. In another implementation, the control and determination unit 120 may generate the detection result DR according to a temperature sensor (not shown in FIG. 2) included in the parallel power supply 200. That is, the detection result DR may also be a temperature detection result.

The display unit 240 (e.g. a light emitting diode) is coupled to the control and determination unit 120, and is arranged for receiving the detection result DR generated from the control and determination unit 120 and playing a video indication signal according to the detection result DR in order to indicate an operation of the power conversion unit 230. In a case where the detection result DR is a voltage detection result, when a voltage component of the DC power signal S_DC outputted from the power conversion unit 230 lies within a predetermined range, the display unit 240 may emit green light according to the received detection result DR in order to indicate that the power conversion unit 230 operates normally; when the voltage component of the DC power signal S_DC outputted from the power conversion unit 230 rises above the predetermined range, the display unit 240 may emit red light according to the received detection result DR in order to indicate that the power conversion unit 230 operates in over-voltage condition. Hence, a test engineer may know that a fault occurs in the parallel power supply 200, and the control and determination unit 120 may disable the detection mechanism of the parallel power supply 200 (e.g. release the built-in test switch 110 implemented by a key switch) according to the first detection signal S_D1 generated from the built-in test switch 110.

In another case where the detection result DR is a temperature detection result, the display unit 240 may play different video indication signals according to the received detection result DR in order to indicate whether the parallel power supply 200 operates in over-temperature condition. Please note that the above is for illustrative purposes only, and is not meant to be a limitation of the present invention. In an alternative design, the display unit 240 may be a display screen, wherein the display screen may be used to display voltage/current data detected by the control and determination unit 120.

In another implementation, the parallel power supply 200 may include an audio unit 242. The audio unit 242 may be coupled to the control and determination unit 120, and arranged for playing an audio indication signal according to the detection result DR in order to indicate an operation of the power conversion unit 230. In a case where the detection result DR is a current detection result, when a current component of the DC power signal S_DC outputted from the power conversion unit 230 lies within a predetermined range, the audio unit 242 may play a lively tune according to the received detection result DR in order to indicate that the power conversion unit 230 operates normally; when the current component of the DC power signal S_DC outputted from the power conversion unit 230 rises above the predetermined range, the control and determination unit 120 may control the power conversion unit 230 to stop outputting the DC power signal S_DC, and the audio unit 242 may play a warning sound according to the received detection result DR in order to indicate that the power conversion unit 230 operates in over-current condition.

In brief, the parallel power supply 200 may inform the test engineer of the operation of the power conversion unit 230 in a visual and/or audible manner. When the test engineer is informed only in the visual manner, the display unit 240 may be disposed in the parallel power supply 200, and the audio unit 242 is omitted; when the test engineer is informed only in the audible manner, the audio unit 242 may be disposed in the parallel power supply 200, and the display unit 240 is omitted; when the test engineer is informed in the visual and audible manners, both the display unit 240 and the audio unit 242 may be disposed in the parallel power supply 200.

As shown in FIG. 2, the parallel power supply 200 is coupled to a load device 250, wherein when the control and determination unit 120 receives a second detection signal S_D2 generated from the load device 250, the control and determination unit 120 may enable the detection mechanism according to the second detection signal S_D2. More specifically, the control and determination unit 120 may control the parallel power supply 200 to power up in order to transmit the DC power signal S_DC to the load device 250, and the control and determination unit 120 may detect the DC power signal S_DC to generate the detection result DR. That is, detection data carried in the detection result DR relates to an operation of the load device 250. The control and determination unit 120 may further determine whether to shut down the parallel power supply 200 according to the detection result DR in order to stop supplying power. In brief, the control and determination unit 120 may enable the detection mechanism according to one of the first detection signal S_D1 and the second detection signal S_D2. Please note that the load device 250 is optional. The test engineer may quickly obtain operation information of the parallel power supply 200 by the built-in test switch 110 even though the parallel power supply 200 is not coupled to a load device/fixture/system.

Figure 3:
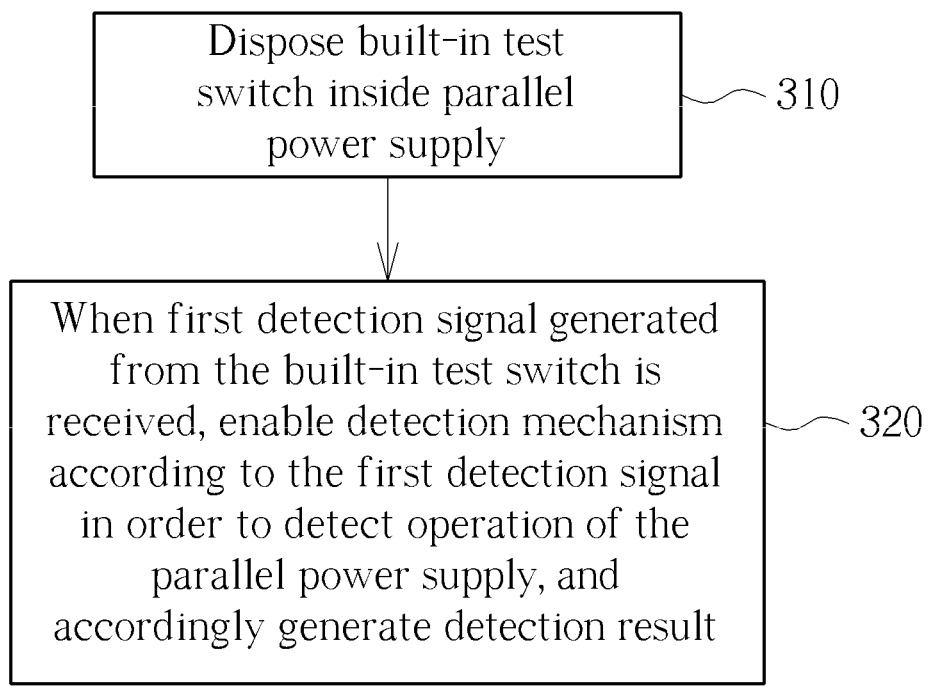
FIG. 3 is a flowchart of an exemplary power detection method for a parallel power supply according to an embodiment of the present invention.

Please refer to FIG. 3, which is a flowchart of an exemplary power detection method for a parallel power supply according to an embodiment of the present invention. The exemplary power detection method includes the following steps:

Step 310: Dispose a built-in test switch inside the parallel power supply.

Step 320: When a first detection signal generated from the built-in test switch is received, enable a detection mechanism according to the first detection signal in order to detect an operation of the parallel power supply, and accordingly generate a detection result.

Figure 4:
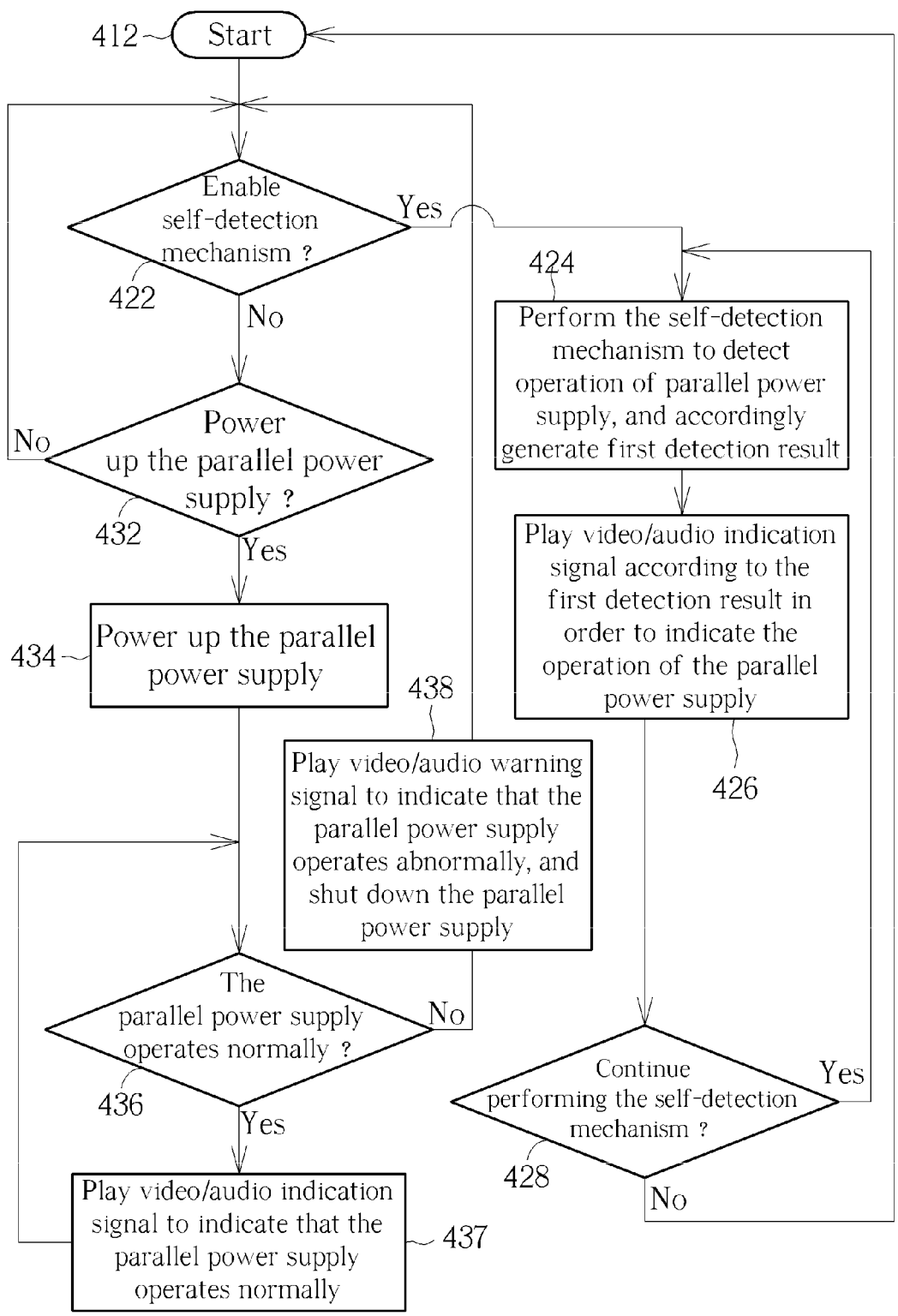
FIG. 4 is a flowchart of an exemplary power detection method for a parallel power supply according to another embodiment of the present invention.

As a person skilled in the art should readily understand the operations of step 310 and step 320 after reading the paragraphs directed to FIG. 1 and FIG. 2, further description is omitted here for brevity. As shown in FIG. 2, the proposed parallel power supply may also enable a detection mechanism according to a detection signal generated from an externally coupled load device. Please refer to FIG. 4, which is a flowchart of an exemplary power detection method for a parallel power supply according to another embodiment of the present invention. The exemplary power detection method includes the following steps:

Step 412: Start.

Step 422: Determine whether to enable a self-detection mechanism. If yes, go to step 424; otherwise, go to step 432.

Step 424: Perform the self-detection mechanism to detect an operation of the parallel power supply, and accordingly generate a first detection result.

Step 426: Play a video/audio indication signal according to the first detection result in order to indicate the operation of the parallel power supply.

Step 428: Determine whether to continue performing the self-detection mechanism. If yes, go to step 424; otherwise, go to step 412.

Step 432: Determine whether to power up the parallel power supply. If yes, go to step 434; otherwise, go to step 422.

Step 434: Power up the parallel power supply.

Step 436: Detect the operation of the parallel power supply, generate a second detection result accordingly, and determine whether the parallel power supply operates normally according to the second detection result. If yes, go to step 437; otherwise, go to step 438.

Step 437: Play a video/audio indication signal to indicate that the parallel power supply operates normally.

Step 438: Play a video/audio warning signal to indicate that the parallel power supply operates abnormally, and shut down the parallel power supply.

Steps 422-428 correspond to the procedure for enabling a detection mechanism (i.e. the self-detection mechanism) by the built-in switch 110 shown in FIG. 1/FIG. 2. Steps 432-438 correspond to the procedure for enabling a detection mechanism by the load device 250 shown in FIG. 2. In one implementation, a built-in switch may be disposed inside the parallel power supply, wherein the built-in switch may be implemented by a key switch. When the key switch is pressed, the self-detection mechanism may be enabled. Please note that the implementation of the built-in switch is for illustrative purposes only, and is not meant to be a limitation of the present invention. As a person skilled in the art should readily understand the operation of each step shown in FIG. 4 after reading the paragraphs directed to FIG. 1 and FIG. 2, further description is omitted here for brevity.

To sum up, the proposed parallel power supply includes a built-in test switch so that the power detection may be performed without inserting the proposed parallel power supply into a system or a fixture. Hence, an internal operation of the power supply may be clarified quickly, and almost no extra cost is required. In addition, a test engineer can readily determine quality of a power supply through a display/audio unit merely by adding a test switch inside the power supply.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A parallel power supply, comprising:
   a built-in test switch, for generating a first detection signal, wherein the first detection signal indicates whether to enable a detection mechanism to detect an operation of the parallel power supply; and
   a control and determination unit, coupled to the built-in test switch, wherein when receiving the first detection signal, the control and determination unit is operative for referring to the first detection signal generated from the built-in test switch to determine whether to enable the detection mechanism to detect the operation of the parallel power supply;
   wherein when the first detection signal indicates enabling the detection mechanism, the control and determination unit detects the operation of the parallel power supply to generate a detection result.

2. The parallel power supply of claim 1, wherein when a load device is externally coupled to the parallel power supply, and the control and determination unit receives a second detection signal generated from the load device, the control and determination unit enables the detection mechanism according to the second detection signal.

3. The parallel power supply of claim 1, wherein the control and determination unit refers to the detection result to determine whether to disable a power supplying operation of the parallel power supply.

4. The parallel power supply of claim 1, further comprising:
   a power conversion unit, coupled to the control and determination unit, the power conversion unit arranged for receiving an alternating-current power signal;
   wherein when the control and determination unit enables the detection mechanism, the control and determination unit controls the power conversion unit to convert the alternating-current power signal into a direct-current power signal, and detects the direct-current power signal to generate the detection result.

5. The parallel power supply of claim 1, further comprising:
   a display unit, coupled to the control and determination unit, the display unit arranged for playing a video indication signal according to the detection result in order to indicate an operation of the power conversion unit.

6. The parallel power supply of claim 1, further comprising:
   an audio unit, coupled to the control and determination unit, the audio unit arranged for playing an audio indication signal according to the detection result in order to indicate an operation of the power conversion unit.

7. The parallel power supply of claim 1, wherein the detection result is a voltage detection result, a current detection result or a temperature detection result.

8. The parallel power supply of claim 1, wherein after the detection mechanism is enabled, the detection mechanism operates until the first detection signal indicates disabling the detection mechanism.

9. A power detection method for a parallel power supply, comprising:
   disposing a built-in test switch inside the parallel power supply;
   when receiving a first detection signal generated from the built-in test switch, referring to the first detection signal generated from the built-in test switch to determine whether to enable a detection mechanism to detect an operation of the parallel power supply, wherein the first detection signal indicates whether to enable the detection mechanism to detect the operation of the parallel power supply; and
   when the first detection signal indicates enabling the detection mechanism, detecting the operation of the parallel power supply to generate a detection result.

10. The power detection method of claim 9, further comprising:
    when receiving a second detection signal generated from a load device externally coupled to the parallel power supply, enabling the detection mechanism according to the second detection signal.

11. The power detection method of claim 9, further comprising:
    referring to the detection result to determine whether to disable a power supplying operation of the parallel power supply.

12. The power detection method of claim 9, wherein the parallel power supply further comprises a power conversion unit arranged for receiving an alternating-current power signal; and the step of enabling a detection mechanism according to the first detection signal in order to detect the operation of the parallel power supply and accordingly generating a detection result comprises:
- controlling the power conversion unit to convert the alternating-current power signal into a direct-current power signal; and
- detecting the direct-current power signal to generate the detection result.

13. The power detection method of claim 9, further comprising:
- playing a video indication signal according to the detection result in order to indicate an operation of the power conversion unit.

14. The power detection method of claim 9, further comprising:
- playing an audio indication signal according to the detection result in order to indicate an operation of the power conversion unit.

15. The power detection method of claim 9, wherein the detection result is a voltage detection result, a current detection result or a temperature detection result.

16. The power detection method of claim 9, wherein after the detection mechanism is enabled, the detection mechanism operates until the first detection signal indicates disabling the detection mechanism.

* * * * *